United States Patent
Sekigawa et al.

[11] Patent Number: 5,144,514
[45] Date of Patent: Sep. 1, 1992

[54] TRANSISTOR DEVICE DRIVE CIRCUIT

[75] Inventors: Kazunari Sekigawa; Hirokazu Tsujimoto, both of Kariya, Japan

[73] Assignee: Kabushiki Kaisha Toyoda Jidoshokki Seisakusho, Kariya, Japan

[21] Appl. No.: 541,832

[22] Filed: Jun. 21, 1990

[30] Foreign Application Priority Data

Jun. 26, 1989 [JP] Japan .................................. 1-160728

[51] Int. Cl.⁵ .......................... H02H 7/00; G05F 1/40
[52] U.S. Cl. ...................................... 361/18; 361/56; 361/79; 361/88; 323/281; 323/282
[58] Field of Search ...................... 361/18, 19, 56, 57, 361/78, 79, 88, 91, 92, 93; 323/281, 282, 285

[56] References Cited

U.S. PATENT DOCUMENTS 4,008,418 2/1977 Murphy ................................. 361/18
4,428,015 1/1984 Nesler .................................... 361/18
4,731,574 3/1988 Melbert ............................... 323/275

Primary Examiner—Steven L. Stephan
Assistant Examiner—Matthew Nguyen
Attorney, Agent, or Firm—Brooks Haidt Haffner & Delahunty

[57] ABSTRACT

A semiconductor device drive circuit is provided for turning on and off a semiconductor device that comprises a main static induction transistor and a sense static induction transistor. The drive circuit comprisees a first current source having one terminal connected to a power supply and its other terminal connected to said main static induction transistor, a second current source having one terminal connected to the power supply and its other terminal connected to said sense static induction transistor, a third current source having terminal connected to the power supply and its other terminal connected to the first current source, and a fourth current source having one terminal connected to the power supply and its other terminal connected to the second current source. The drive circuit also has comparing and control means for turning the first and second current sources on to apply a bias when the semiconductor device is to be turned on and for turning off the first and second current sources and turning on the third and fourth current sources when a voltage obtained by sensing a current flowing through the sense static induction transistor is higher than a specific voltage.

10 Claims, 7 Drawing Sheets

5,144,514

TRANSISTOR DEVICE DRIVE CIRCUIT

BACKGROUND OF THE INVENTION

1. Field of the Invention

The present invention relates to a drive circuit for a static induction transistor and, more particularly, to a semiconductor device drive circuit for controlling the driving of a semiconductor device comprised of a main static induction transistor and a sense static induction transistor by a sense current flowing through the sense static induction transistor.

2. Description of the Related Art

Static induction transistors have been developed and used as high-power switching devices, particularly as low-voltage high-current switching devices. Although such static induction transistors (SITs) can handle low voltage and high current, they may suffer breakdown if, for example, a failure (a short) occurs in a load. Thus, an SIT is designed such that a main SIT and a sense SIT are combined into a single semiconductor device. Their drains are connected to a common drain terminal, and their gates and sources are connected to their respective terminals. Thus, the SIT has a five-terminal structure. In order to avoid the breakdown of SITs, a method is frequently used in which the entire current is caused to flow through the semiconductor device by use of a current flowing through the sense SIT and the main SIT and the sense SIT are turned off when a current higher than a specific value flows through the sense SIT.

FIG. 1 illustrates the configuration of a prior art circuit. Resistors $R_G$ and $R_{GS}$ each have one of their ends connected to a gate terminal of a semiconductor circuit (a semiconductor device) comprising a main SIT and a sense SIT. They have their other ends connected to the positive terminal (Vcc) of a power supply B via a switch SW. Connected to an input signal source S is a control circuit 10 which, when an input signal thereto reaches a high-level, turns switch SW on to supply currents $I_G$ and $I_{GS}$ to the gates of the semiconductor circuit through resistors $R_G$ and $R_{GS}$, thereby turning on the main SIT and sense SIT. As a result, a current $I_D$ flows through a load $R_L$. At this time, namely, when the main SIT and the sense SIT are turned on, the ratio of the current flowing through the main SIT to the current flowing through the sense SIT is k:1. The main SIT has its source connected to the negative terminal of power supply B and the sense SIT has its source connected to the negative terminal of power supply B via a resistor $R_S$. Since the ratio of the main SIT current to the sense SIT current is k:1, the voltage (Vs) developed across resistor $R_S$ connected to the source of the sense SIT will give a measure of the entire current flowing through the semiconductor device. In case where, for example, load $R_L$ is defective and hence shorted, current increases and voltage Vs across resistor $R_S$ also increases. Voltage Vs is applied to an overcurrent protection circuit 11 which compares the magnitude of Vs with a specific value. When the voltage Vs is higher than the specific value, namely, when a current sufficient to cause the breakdown of the semiconductor device flows through it, overcurrent protection circuit 11 prompts control circuit 10 to turn switch SW off.

The above operation enables the prior art circuit to avoid the breakdown of the semiconductor device, which serves as a switching device, that is, due to a defect in the load.

When the semiconductor device is used for a switch, however, the sense SIT and the main SIT each have to be driven to saturation. The reason for this is as follows. With the sense SIT nonsaturated (for example, when supply voltage is low), even if the load is shorted and hence an excessive current flows through the main SIT, it cannot be sensed and thus the main SIT suffers breakdown. With the sense SIT saturated and the main SIT nonsaturated, on the other hand, no excessive current will flow through the main SIT even when the load is shorted. During normal use of the semiconductor device, however, the main SIT cannot be completely turned on and the sense SIT may suffer breakdown.

In the conventional breakdown preventing system, a current is sensed by use of the sense SITs of the semiconductor device, thus turning it off, when a current exceeding the maximum rating flows. The current $I_{GS}$ flowing into the gate of the sense SIT will vary with the supply voltage Vcc of power supply B because the gates of the device are biased through resistors $R_S$ and $R_{GS}$. For this reason, the current flowing into the sense SIT will be low even if a short is caused by a defect in load resistor $R_L$. As a result, voltage Vs across resistor $R_S$ may be lower than the specific voltage. Thus, a problem with the prior art is that, when the supply voltage is low, an excessive current cannot be detected even if the load is defective, thereby causing the breakdown of the semiconductor device. In other words, with the prior art circuit using the semiconductor device, the sense SIT is not completely turned on unless it is sufficiently saturated and the sense voltage Vs is too low to detect an excessive current even if load $R_L$ is shorted. Furthermore, the lowered supply voltage will also make $I_{GS}$ low, thus activating only the sense SIT and causing its breakdown when load $R_L$ is shorted.

SUMMARY OF THE INVENTION

An object of the present invention is to provide a semiconductor device drive circuit which permits accurate detection of a current flowing through a semiconductor device to prevent it from breaking down, irrespective of the magnitude of the supply voltage used.

FIG. 2A is a block diagram of the present invention. The present invention is directed to a control circuit for turning on and off a semiconductor device comprised of a main static induction transistor and a sense induction transistor.

A first current source 1 has one end connected to a power supply (V) and the other end connected to the main static induction transistor. When turned on, current source 1 applies bias to the main static induction transistor.

A second current source 2 has one end connected to the power supply (V) and the other end connected to the sense static induction transistor. When turned on, current source 2 applies bias to the sense static induction transistor.

A third current source 3 has one end connected to ground (G) and the other end connected to the other end of the first current source. When turned off, current source 3 connects the gate of the main static induction transistor to ground.

A fourth current source 4 has one end connected to ground (G) and the other end connected to the other end of the second current source. When turned off, current source 4 connects the gate of the sense static induction transistor to ground.

A comparator and control means 5 turns the first and second current sources on when the semiconductor device is on, thereby applying bias to the gates of the main static induction transistor and the sense static induction transistor. When the magnitude of a sense voltage resulting from a current flowing through the sense static induction transistor is higher than a specific value, the comparator and control means turns the first and second current sources off and the third and fourth current sources on.

To turn on the semiconductor device comprised of the main static induction transistor and the sense static induction transistor, comparator and control means 5 turns on first and second current sources 1 and 2 to apply currents from power supply V to the gates of the main static induction transistor and sense static induction transistor. At this point, third and fourth current sources 3 and 4 are off.

If the load circuit is shorted with the semiconductor device turned on (and hence a current flowing through a load circuit), so that an excessive current flow is produced, the sense voltage will become higher than the specific value. Upon detecting that the sense voltage is more than the specific value, comparator and control means 5 turns first and second current sources 1 and 2 off. At the same time, comparator and control means 5 turn third and fourth current sources 3 and 4 off. Third and fourth current sources 3 and 4 are adapted to discharge electric charges stored in the gates of the main static induction transistor and sense static induction transistor.

The sense static induction transistor has its gate current flow produced by second current source 2 and is thus turned on by a constant current independently of the supply voltage V. That is, the sense static induction transistor is driven into saturation, thereby producing a sense voltage adapted to exactly detect an excessive current due to a short of the load. Electric charges stored in the gates of the main and sense static induction transistors are rapidly discharged by third and fourth current sources 3 and 4 when the transistors are to be turned off, thus permitting fast switching operation of the transistors. This prevents the static induction transistors from breaking down.

DETAILED DESCRIPTION OF THE PREFERRED EMBODIMENTS

Figure 1:
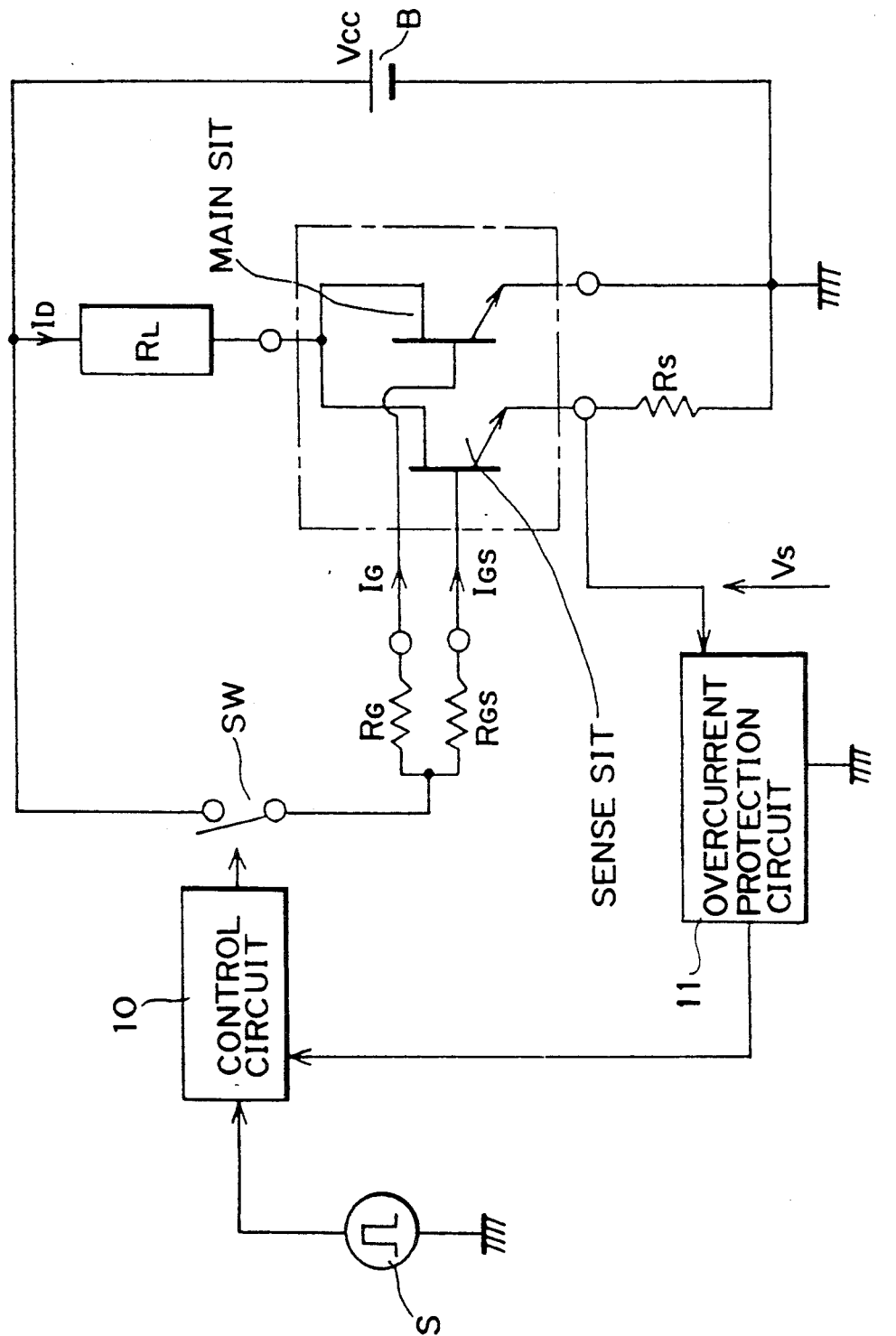
FIG. 1 illustrates a circuit arrangement of a prior art drive circuit.
Figure 2A:
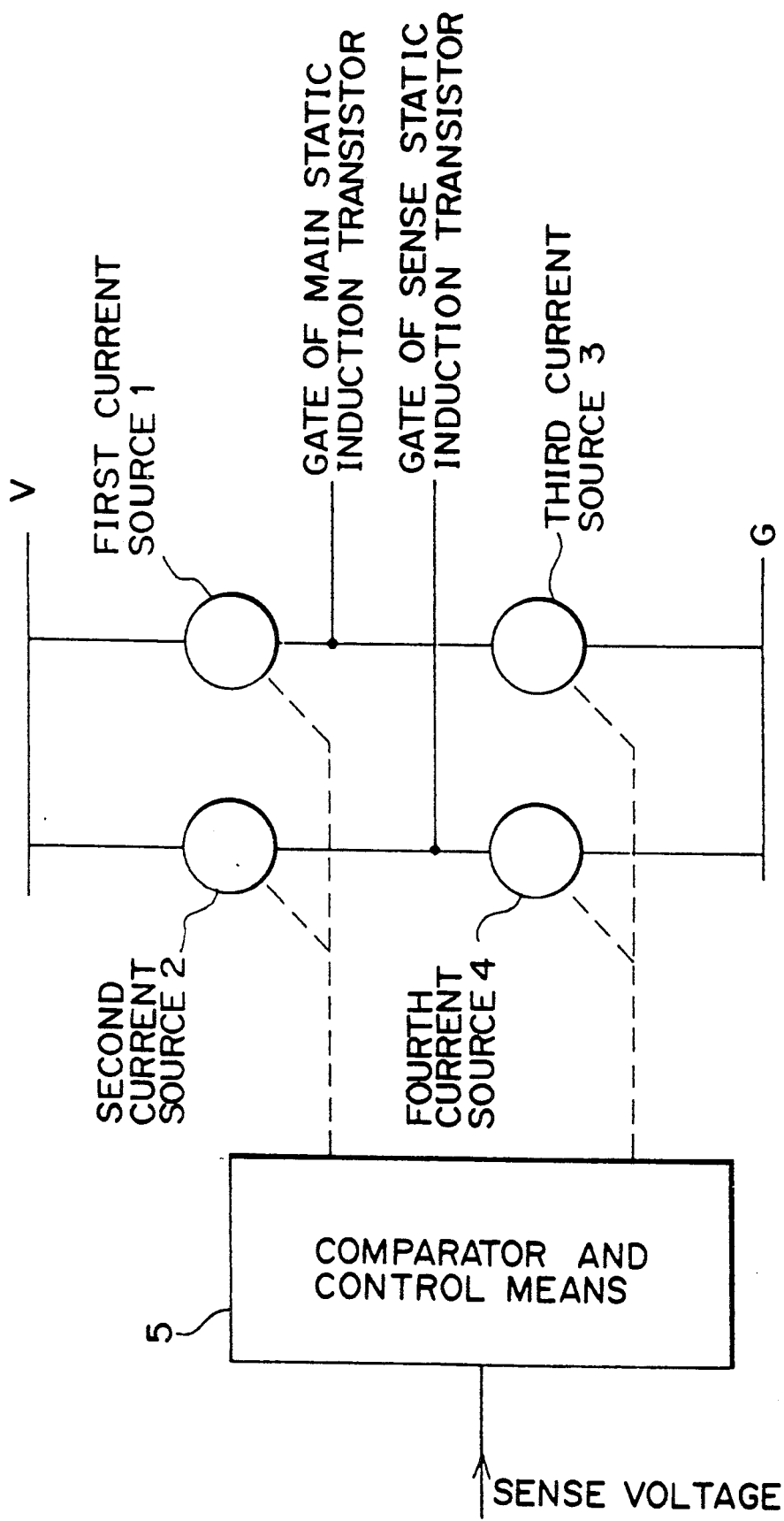
FIG. 2A is a basic block diagram of a transistor drive circuit of the present invention.
Figure 2B:
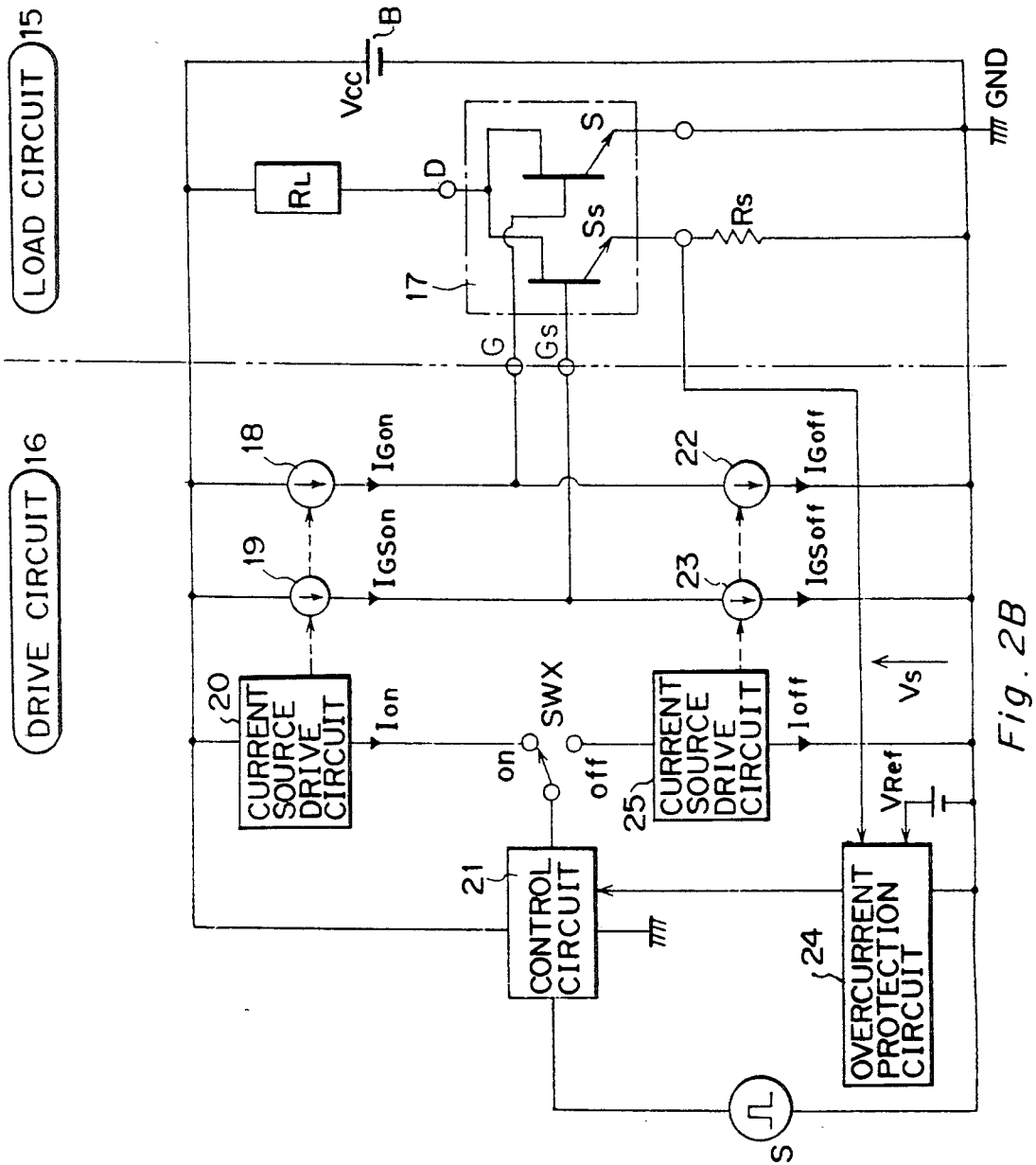
FIG. 2B illustrates a circuit arrangement of a first embodiment of the present invention.

Referring now to FIG. 2B, which illustrates a circuit arrangement of an embodiment of the present invention, a load circuit 15 comprises a power supply B, a load $R_L$, a semiconductor device 17 having a main static induction transistor (main SIT) and a sense static induction transistor (sense SIT), and a resistor $R_S$. A common drain of the semiconductor device is connected to the positive terminal Vcc of power supply B via load $R_L$. The main SIT has its source S connected to the negative terminal of power supply B, while the sense SIT has its source $S_S$ connected to the negative terminal of power supply B via resistor $R_S$. The negative terminal of power supply B is connected to ground (GND).

When currents flow into gate G of the main SIT and gate $G_S$ of the sense SIT, they are turned on to thereby produce a current flow through the load. If, at this point, the gate current of the main SIT is assumed to be, for example, 300 mA, the gate current of the sense SIT will be of the order of 5 mA. The main and sense SITs are driven into saturation, i.e., turned on by their respective gate currents. (The maximum current in the on state is substantially determined by the gate currents of the main and sense SITs.)

By means of resistor $R_S$ connected to the source of the sense SIT, the current flowing through the sense SIT can be converted to a voltage which is developed across $R_S$. By use of the voltage across $R_S$ and the ratio K of the current flowing through the sense SIT to the current flowing through the main SIT, the total current, i.e., the drain current of the semiconductor device, can be found.

A drive circuit 16 for driving load circuit 15 includes current sources 18 and 19, a current source drive circuit 20 and a control circuit 21, connected each at one of its ends to the positive terminal Vcc of power supply B. Control circuit 21 is also connected to a common terminal of a switch SWx. A fixed terminal (On) of switch SWx is connected to the other end of the current source drive circuit 20. Upon receipt of a drive signal from drive signal source S, control circuit 21 connects the moving terminal of switch SWx to its fixed terminal (On) so that a current Ion is supplied from current source drive circuit 20 to control circuit 21. With this flow of current Ion, current source drive circuit 20 turns current sources 19 and 18 on. Current source 18 is adapted to conduct a current $I_{Gon}$, while current source 19 is adapted to conduct a current $I_{GSon}$. When current sources 18 and 19 are on, current sources 22 and 23, which are respectively connected to current sources 18 and 19, are turned off. (No current flows through current source drive circuit 25 so that current sources 22 and 23 are not driven.)

The common connection point of current sources 18 and 22 is connected to gate G of the main SIT, while the common connection point of current sources 19 and 23 is connected to gate $G_S$ of the sense SIT. Since current sources 22 and 23 are now off, the currents supplied from current sources 18 and 19 are caused to flow entirely into gates G and $G_S$ of the main and sense SITs, respectively. As described above, these currents $I_{Gon}$ and $I_{GSon}$ are 300 mA and 5 mA, respectively. Since load $R_L$ has one end connected to the power supply and its other end connected to ground via semiconductor device 17 when it is on, a current supplied from the power supply flows into the load.

If load $R_L$ should be shorted due to its defect, an excessive current will flow. This excessive current will also flow through the main SIT and the sense SIT. (At this point the ratio between currents flowing through the main and sense SITs is K:1 as in the prior art.) A voltage is developed across resistor $R_S$ by the current flowing through the sense SIT for application to overcurrent protection circuit 24.

Overcurrent protection circuit 24 is connected to the positive terminal of a reference voltage source which provides a reference voltage $V_{Ref}$. The negative terminal of the reference voltage source is connected to ground. Overcurrent protection circuit 24 compares the reference voltage $V_{Ref}$ with the voltage across resistor $R_S$ and, when the voltage across resistor $R_S$ is higher than the reference voltage, applies an off signal to control circuit 21. In response to the off signal, control circuit 21 places switch SWx in the Off position. Once this switching is made, the switch remains in the Off position unless it is reset.

The terminal (Off) of switch SWx is connected to current source drive circuit 25. (The other end of current source drive circuit 25, the other terminals of current sources 22 and 23 and overcurrent protection circuit 24 are connected to ground.) When switch SWx is placed in the Off position, a current flow is produced in current source drive circuit 25. When driving current source drive circuit 20, control circuit 21 connects the common terminal to ground to thereby connect current source drive circuit 20 to ground. However, when driving current source drive circuit 25, control circuit 21 connects the common terminal to the potential (Vcc) of power supply B to thereby apply the voltage to the power supply terminal of current source drive circuit 25. At this point current source drive circuit 25 operates to turn current sources 22 and 23 on. When switch SWx is placed in the Off position, current source drive circuit 20 is left open at its end to stop its operation. This turns current sources 18 and 19 off. As a result, the bias to the semiconductor device 17 becomes zero so that it is turned off. This off can prevent breakdown of the semiconductor device. When switch SWx is placed in the Off position, current sources 22 and 23 are turned on as described above, thus connecting gates G and $G_S$ to ground. The currents from gates G and $G_S$ are caused to flow to ground. The gates of the main and sense SITs naturally have stray capacitances. Merely turning biasing current sources 18 and 19 off will not allow the main and sense SITs to be turned off immediately because of electric charges stored in the stray capacitances. However, the electric charges can be swept out of the gates by current sources 22 and 23 so that the main and sense SITs are turned off immediately.

Because there is no closed circuit in the prior art, the semiconductor device remains on until the electric charges are discharged naturally and may suffer breakdown during the discharging period. According to an embodiment of the present invention, however, the semiconductor device is driven by current sources 18 and 19, and not by resistors as in the prior art. This permits the semiconductor device to be turned on independently of the magnitude of power supply voltage Vcc. That is, each SIT can be saturated so that a proper current is allowed to flow therethrough even if the power supply voltage is lowered. Furthermore, even if, in the event of a failure, an excessive current flows, current sources 22 and 23 are turned on at the same time current sources 18 and 19 are turned off. This allows electric charges stored in the gates to be discharged immediately, thus turning the semiconductor device off quickly.

Figure 3A:
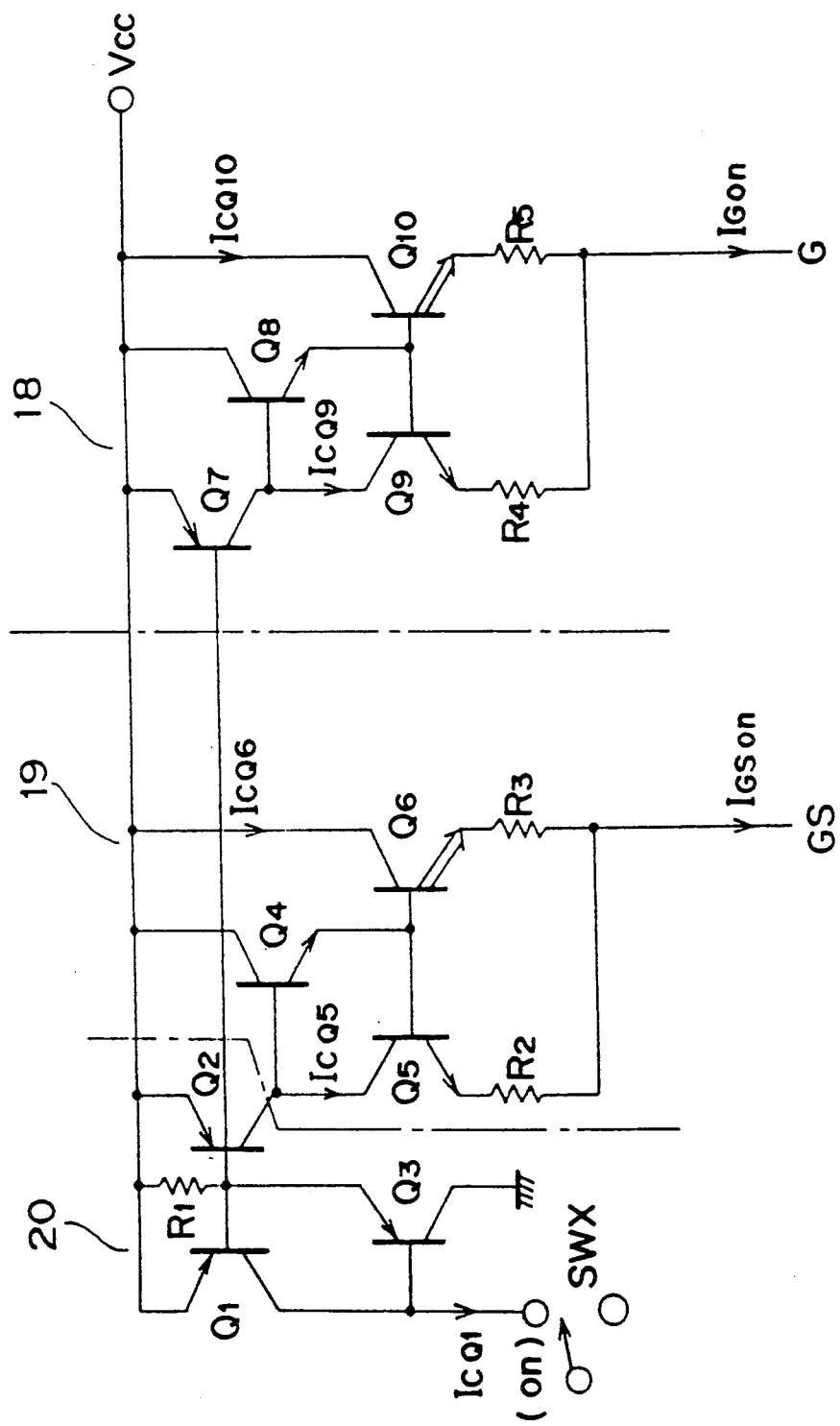
FIGS. 3A to 3C are detailed circuit diagrams of the current sources and the current source drive circuits.

FIG. 3A illustrates detailed circuit arrangements of current sources 18 and 19 and current source drive circuit 20. Current sources 18 and 19 have substantially the same configurations as follows. Transistors $Q_{10}$ and $Q_6$ have their collectors connected to the positive terminal Vcc of power supply B and their emitters respectively connected to gates G and $G_S$ of the main and sense SITs via resistors $R_5$ and $R_3$. Transistors $Q_8$ and $Q_4$ have their collectors connected to the positive terminal Vcc of power supply B and their emitters connected to bases of transistors $Q_{10}$ and $Q_6$, respectively. Transistor $Q_7$ has its emitter connected to the positive terminal Vcc of power supply B and its collector connected to the base of transistor $Q_8$ and the collector of transistor $Q_9$. Transistor $Q_2$ has its emitter connected to the positive terminal Vcc of power supply B and its collector connected to the base of transistor $Q_4$ and the collector of transistor $Q_5$. The bases of transistors $Q_9$ and $Q_5$ are connected to the bases of transistors $Q_{10}$ and $Q_6$, respectively. The emitters of transistors $Q_9$ and $Q_5$ are respectively connected to gates G and $G_S$ via resistors $R_4$ and $R_2$.

In current source drive circuit 20, a resistor $R_1$ has one end connected to power supply B and its other end connected to the bases of transistors $Q_7$ and $Q_2$. A transistor $Q_1$ has its emitter connected to power supply Vcc and its base connected to the other end of resistor $R_1$ and the emitter of transistor $Q_3$. Transistor $Q_3$ has its collector connected to ground and its base connected to the collector of transistor $Q_1$ and a fixed terminal (On) of switch SWx. Transistors $Q_1$ to $Q_3$ and $Q_7$ are PNP transistors, while the remaining transistors are NPN transistors. Transistors $Q_6$ and $Q_{10}$ have a larger chip area than transistors $Q_5$ and $Q_9$ so that most of the currents flowing through gates G and $G_S$ flow through transistors $Q_6$ and $Q_{10}$. This will be described later.

When switch SWx is placed in the On position, the On terminal is placed at ground potential with the result that transistor $Q_3$ is turned on and thus a specific current flows through resistor $R_1$. With a flow of current through resistor $R_1$ the base potentials of transistors $Q_1$, $Q_2$ and $Q_7$ become lower than their emitter potential so that they are also turned on. Thus, supply voltage Vcc is supplied to the bases of transistors $Q_4$ and $Q_8$ so that they are also turned on. This turns on transistors $Q_5$, $Q_6$, $Q_9$ and $Q_{10}$. These transistors form current mirrors. Since $$I_{CQ5} \approx I_{CQ9} \approx I_{CQ1}$$

$$I_{CQ6} \approx (k_2-1)I_{CQ5}$$

$$I_{CQ10} \approx (k_1-1)I_{CQ9}$$

$$I_{Gon} = I_{CQ9} + I_{CQ10} = k_1 I_{CQ1}$$

$$I_{GSon} = I_{CQ5} + I_{CQ6} = k_2 I_{CQ1}$$

It should be noted herein that transistor $Q_{10}$ has an emitter area which is $(k_1-1)$ times that of transistor $Q_9$ and transistor $Q_6$ has an emitter area which is $(k_2-1)$ times that of transistor $Q_5$. Furthermore, resistor $R_4$ has a value of $(k_1-1)$ times that of resistor $R_5$, while resistor $R_2$ has a value of $(k_2-1)$ times that of resistor $R_3$. (Resistors $R_2$, $R_3$, $R_4$ and $R_5$ are provided for negative feedback to make each of $k_1$ and $k_2$ approximate its respective desired value where transistors $Q_5$, $Q_6$, $Q_9$ and $Q_{10}$ show manufacturing process variations in emitter area.)

By the action of the current mirrors described above, when $I_{CQ1}$ flows, $I_{Gon}$ and $I_{GSon}$ flow correspondingly. These specific currents flow into gates G and $G_S$ of semiconductor device 17 to bring the main SIT and the sense SIT into saturation.

In the above, an embodiment of the present invention was described in connection with a semiconductor device in which a current flow is made from drain to source. Obviously, the present invention may also be applied to a semiconductor device in which a current flows from source to drain.

Figure 3B:
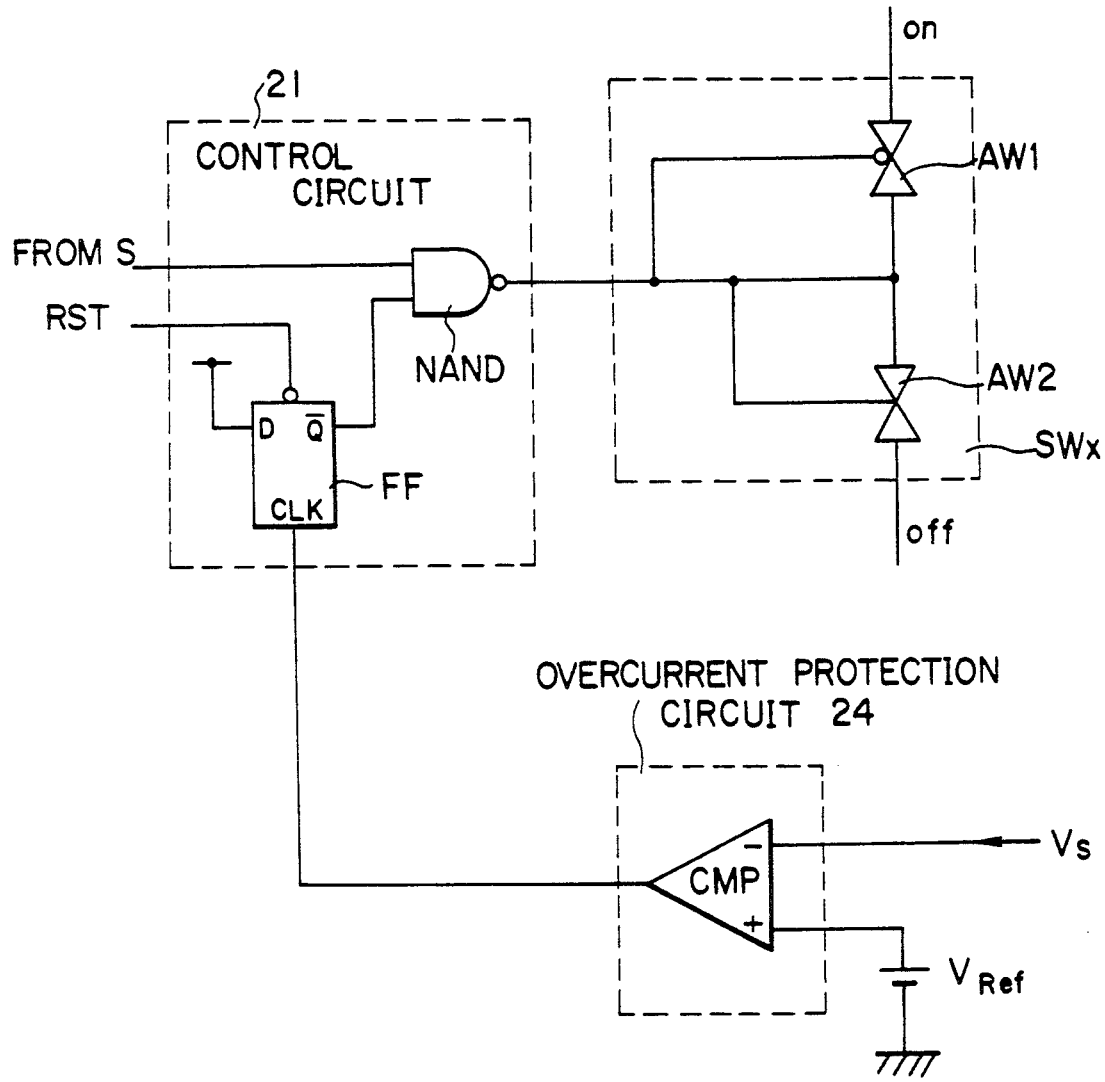

FIG. 3B illustrates detailed circuit arrangements of overcurrent protection circuit 24, control circuit 21 and switch SWx. Overcurrent protection circuit 24 comprises a comparator CMP. Comparator CMP has its noninverting input connected to reference voltage $V_{Ref}$ and its inverting input connected to voltage Vs across resistor $R_S$. Comparator CMP makes a comparison between these voltages and produces when $V_{Ref}>V_S$ (normal state) and a low-level output when $V_{Ref} \leq V_S$ (overcurrent state). The output of comparator CMP is coupled to the clock input of a flip-flop FF in control circuit 21.

Control circuit 21 is comprised of a NAND gate NAND and a flip-flop FF. Flip-flop FF is a D-type flip-flop and has its output $\bar{Q}$ connected to an input of NAND gate NAND. When the power supply is turned on, flip-flop FF is reset by a reset signal RST so that its output $\bar{Q}$ goes high. With this output $\bar{Q}$, NAND gate NAND is enabled to invert a signal from input signal source S for application to switch SWX. That is, a high-level signal from signal source S is inverted to a low-level and vice versa.

The output of NAND gate NAND is connected to each of control terminals of analog switches $AW_1$ and $AW_2$ and the connection point of $AW_1$ and $AW_2$. Analog switch $AW_2$ is turned on when its control terminal goes high and is turned off when it goes low. In contrast with analog switch $AW_2$, analog switch $AW_1$ is turned on when its control terminal goes low and is turned off when it goes high.

When the output of NAND gate NAND goes low, analog switch $AW_1$ is turned on, while analog switch $AW_2$ is turned off. Thus, the on terminal On of switch SWX is rendered low in potential. This allows current source drive circuit 20 described above to drive current sources 18 and 19, thereby turning semiconductor device 17 on. When the output of NAND gate NAND goes high, on the other hand, analog switch $AW_2$ is turned on, while analog switch $AW_1$ is turned off. As a result, the off terminal (Off) of switch SWX goes high. This allows current source drive circuit 25, described above, to drive current sources 22 and 23 so that semiconductor device 17 is turned off. That is, in the normal state, semiconductor device 17 is turned on or off according to the level of the input signal from input signal source S.

When voltage Vs applied to comparator CMP goes higher than reference voltage $V_{Ref}$, on the other hand, comparator CMP produces a low-level output. In response to a transition of the output of comparator CMP from high-level to low-level (from normal state to overcurrent state), the flip flop takes a high-level input at its D terminal so that its output $\bar{Q}$ goes low. When the output $\bar{Q}$ of the flip-flow goes low, NAND gate NAND is disabled so that its output remains high independently of the signal from signal source S. This allows current source drive circuit 25 to operate, with the result that semiconductor device 17 is always turned off. To sum up the above operation, semiconductor device 17 is turned on and off by the input signal from signal source S in the normal state, while it is turned off when an overcurrent state is detected.

Figure 3C:
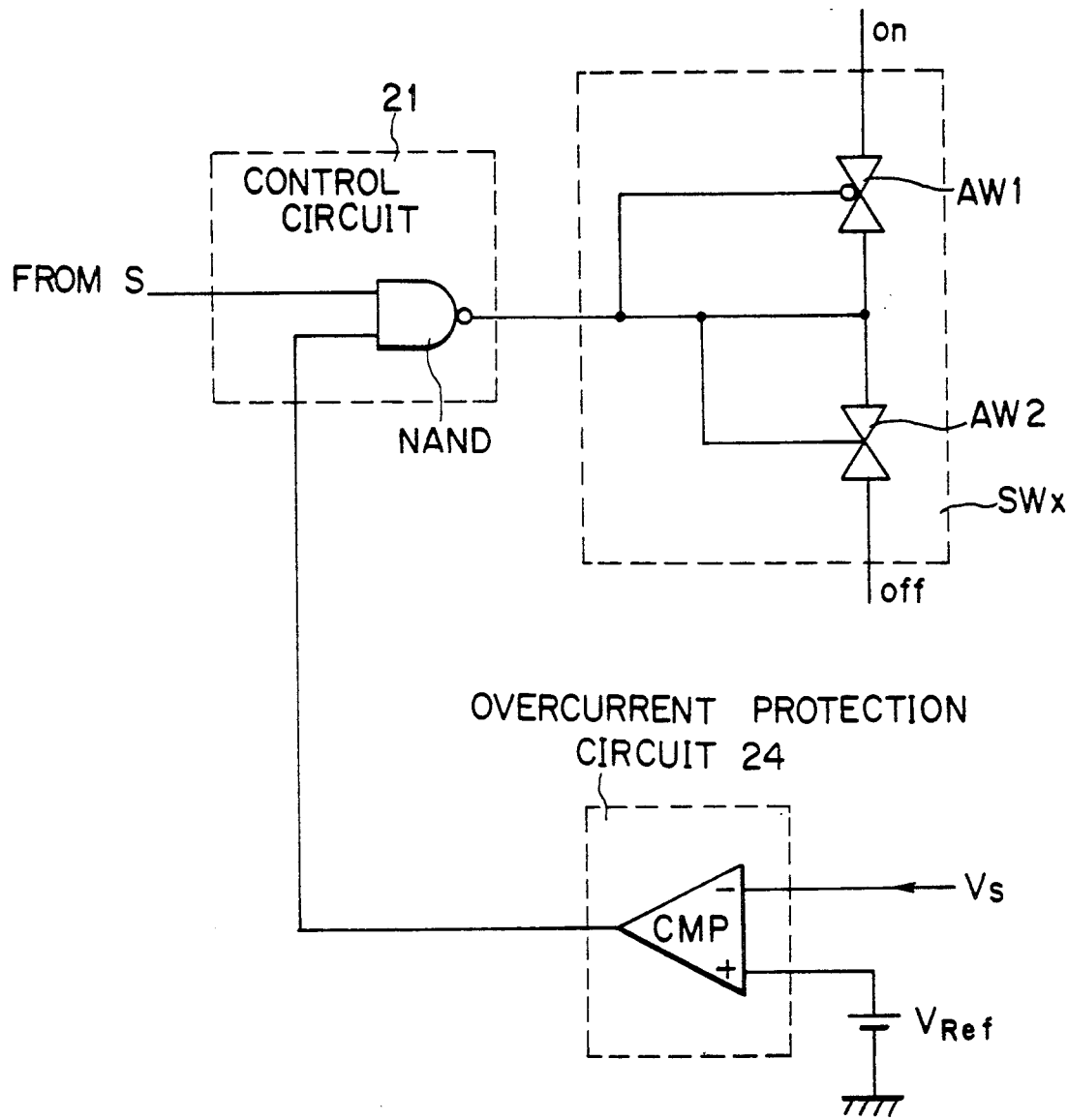

FIG. 3C illustrates another circuit arrangement of control circuit 21. In this control circuit, flip-flop FF in control circuit 21 of FIG. 3B is excluded and the output of comparator CMP is directly coupled to NAND gate NAND instead. With flip-flop FF included as in FIG. 3B, once an overcurrent state occurs, current flow is stopped. In FIG. 3C, once an overcurrent state is detected, NAND gate NAND is disabled. That is, when comparator CMP detects $V_{Ref} \leq V_S$, the NAND gate is disabled to allow switch SWX to operate current source drive circuit 25. Thus, semiconductor device 17 is turned off so that current flow through the load is stopped. When the current flowing through the load becomes zero, comparator CMP produces an output at high level (normal state) again. In this case, when the signal from input signal source S goes high, current source drive circuit 21 operates so that semiconductor device 17 is turned on again to make a current flow through the load. If the load is abnormal due to a short, an overcurrent will flow through the load again to repeat the above operation. This repeat depends on the loop delay time. By making the on time of the semiconductor device short when the load is abnormal, it is possible to prevent the semiconductor device from breaking down even if an abnormality, such as a short, occurs in the load.

Figure 4:
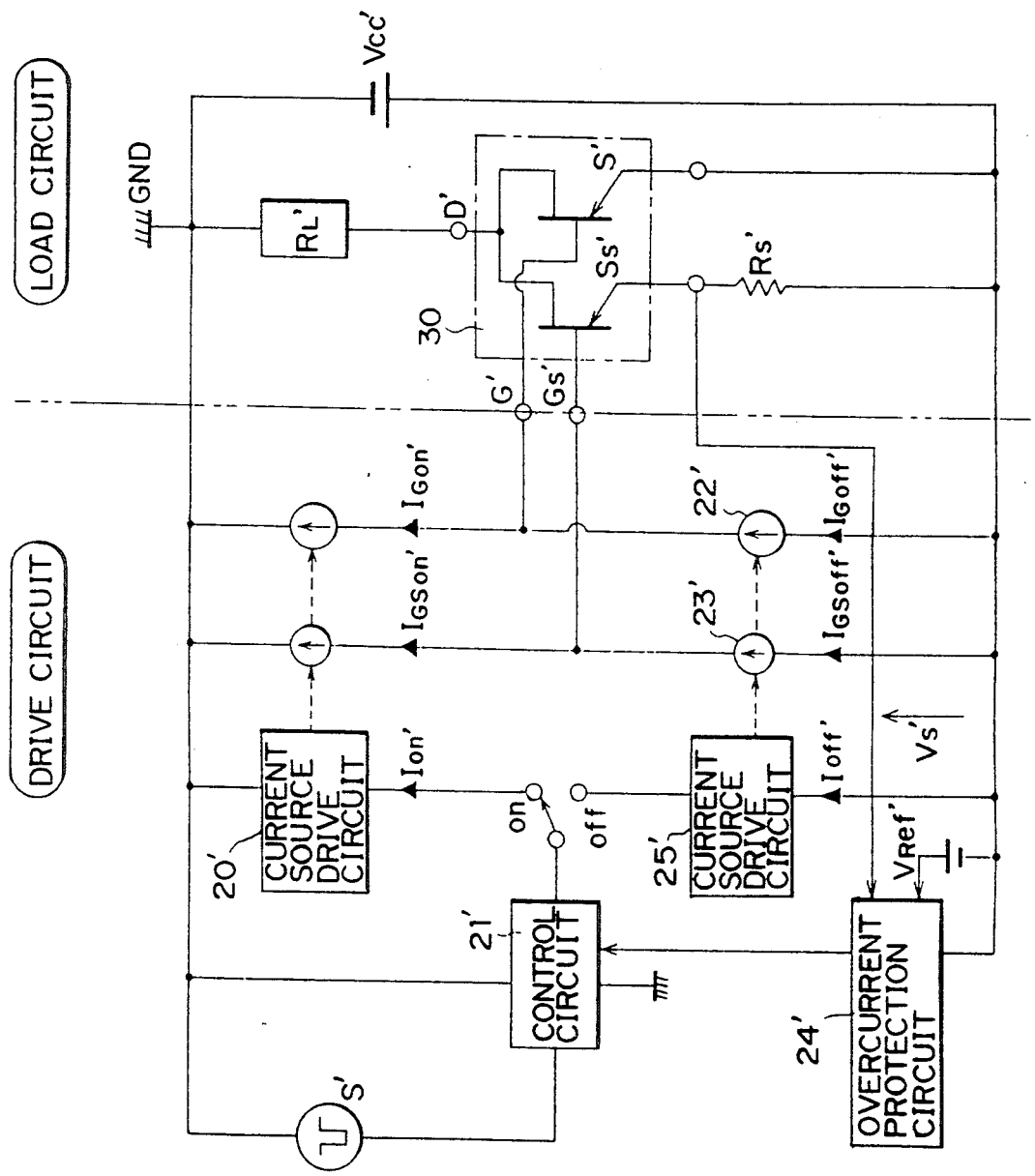
FIG. 4 illustrates a circuit arrangement of a second embodiment of the present invention.

FIG. 4 illustrates a circuit arrangement of a second embodiment of the present invention. In this case, semiconductor device 30 is of opposite polarity to semiconductor device 17 described above. Thus, currents flow in the opposite direction to that in the first embodiment. The same operation will be performed if each of the circuits is made to be of opposite polarity to its respective corresponding circuit.

As described above, since biases are applied by current sources even if power supply voltage varies, substantially constant currents $I_{GSon}$ and $I_{Gon}$ are supplied and a sense gain is never lowered.

If two independent current sources were composed of discrete components, a complex circuit arrangement would be needed to compensate for variations in component characteristics. As with the embodiments of the present invention, if the current sources are made of semiconductor device drive circuits of 1 chip, the two independent current sources can be made of simple circuits because variations in characteristics of components which are placed close to each other are small. In addition, the outputs of the two independent current sources are connected together, and a drive circuit applicable to a normal three-terminal transistor may be implemented.

According to the present invention, as described above, where a semiconductor device having a main SIT and a sense SIT is used as a switch for driving a load, when a shorted state is caused by a defect of the load, a sense current can be detected independently of the magnitude of a power supply voltage and the semiconductor device can be turned off to prevent its breakdown.

What is claimed is:

1. A semiconductor device drive circuit for turning on and off a semiconductor device having a main static induction transistor and a sense static induction transistor with the latter having a source area 1/k of that of the former, wherein k is an integer, said drive circuit comprising:

a first current source means having a first terminal for connection to a first terminal of a power supply and having a second terminal for connection to a gate of said main static induction transistor for applying a bias to said main static induction transistor when said first current source means is operated;

a second current source means having a first terminal for connection to said first terminal of said power supply and a second terminal for connection to said sense static induction transistor for applying a bias to said sense static induction transistor having a current value of 1/k of that of said first current source means when said second current source means is operated;

a third current source means having a first terminal grounded and a second terminal connected to said second terminal of said first current source means;

a fourth current source means having a first terminal grounded and a second terminal connected to said second terminal of said second current source means; and comparing and control means including a source of reference voltage and means for coupling to said semiconductor device for sensing the current flowing through said sense static induction transistor, said comparing and control means being coupled to all of said current source means for turning said first and second current source means on for applying said bias when said semiconductor device is to be turned on, and for turning off said first and second current source means and turning on said third and fourth current source means when the voltage obtained by sensing said current flowing through said sense static induction transistor is higher than said reference voltage.

2. A semiconductor device drive circuit according to claim 1, in which drains of said main static induction transistor and said sense static induction transistor are connected in common to one end of a load whose other end is connected to said terminal of said power supply.

3. A semiconductor device drive circuit according to claim 1, in which said sensing of said current flowing through said sense static induction transistor is accomplished by means of a resistor having one of its ends connected to a source of said sense static induction transistor and its other end connected to a second terminal of said power supply.

4. A semiconductor device drive circuit according to claim 3, in which said comparing and control means comprises a first current source drive circuit for driving said first and second current source means, a second current source drive circuit for driving said second and third current source means, a protection circuit for comparing the voltage drop across said resistor in response to current flow therethrough with said reference voltage, and a control circuit for operating said first current source drive circuit in response to an application of a drive signal thereto when said reference voltage is higher than said voltage drop across said resistor and for operating said second current source drive circuit when said drive signal is not applied thereto or when said reference voltage is lower than said voltage drop across said resistor.

5. A semiconductor device drive circuit according to claim 4, in which said control circuit operates only said second current source drive circuit until it is reset after said protection circuit detects that said voltage drop across said resistor is higher than said reference voltage.

6. A semiconductor device drive circuit according to claim 4, in which one power input terminal of said first current source drive circuit is connected to said first terminal of said power supply, one power input terminal of said second current source drive circuit is connected to said second terminal of said power supply, and said control circuit has a switch means for connecting another power input terminal of said first current source drive circuit to said second terminal of said power supply to operate said first current source drive circuit and for connecting another power input terminal of said second current source drive circuit to said first terminal of said power supply to operate said second current source drive circuit.

7. A semiconductor device drive circuit according to claim 1, in which said first current source means comprises first and second resistors each having one end connected to a gate of said main static induction transistor, a first transistor having a collector connected to said first terminal of said power supply and an emitter connected to the other end of said first resistor, a second transistor having a collector connected to said first terminal of said power supply and an emitter connected to a base of said first transistor, and a third transistor having a collector connected to a base of said second transistor, an emitter connected to the other end of said second resistor and a base connected to a junction of said base of said first transistor and said emitter of said second transistor.

8. A semiconductor device drive circuit according to claim 1, in which said second current source means comprises first and second resistors each having one end connected to a gate of said sense static induction transistor, a first transistor having a collector connected to said first terminal of said power supply and an emitter connected to the other end of said first resistor, a second transistor having its collector connected to said first terminal of said power supply and an emitter connected to a base of said first transistor, and a third transistor having a collector connected to a base of said second transistor, an emitter connected to the other end of said second resistor and a base connected to a junction of said base of said first transistor and said emitter of said second transistor.

9. A semiconductor device drive circuit according to claim 4, in which said first current source drive circuit comprises a second resistor having one end connected to said first terminal of said power supply, first, second and third transistors each having an emitter connected to said first terminal of said power supply and a base connected to another end of said second resistor, and a fourth transistor having an emitter connected to said another end of said second resistor, a base connected to a collector of said first transistor and to said control circuit, and a collector connected to said second terminal of said power supply, said second and third transistors each having a collector connected, respectively, to said first and second current source means.

10. A semiconductor device drive circuit for turning on and off a semiconductor device having a main static induction transistor and a sense static induction transistor with the latter having a source area 1/k of that of the former, wherein k is an integer, said drive circuit comprising:

a first current source means having a first terminal for connection to a first terminal of a power supply and having a second terminal for connection to a gate of said main static induction transistor for applying a bias to said main static induction transistor when said first current source means is operated;

a second current source means having a first terminal for connection to said first terminal of said power supply and a second terminal for connection to said sense static induction transistor for applying a bias to said sense static induction transistor having a current value 1/k of that of said first current source means when said second current source means is operated;

a third current source means having a first terminal grounded, and a second terminal connected to the gate of said main static induction transistor, for discharging the charge accumulated by the gate of said main static induction transistor when the latter is not operated;

a fourth current source means having a first terminal grounded, and a second terminal connected to the gate of said sense static induction transistor, for discharging the charge accumulated by the gate of said sense static induction transistor when the latter is not operated;

a first current source drive circuit for driving said first and second current source means when said semiconductor device is to be turned on;

a second current source drive circuit for driving said third and fourth current source means when said semiconductor device is to be turned off;

a sense resistor having one of its ends connected to a source of said sense static induction transistor, its other end connected to a second terminal of said power source, whereby a source current of said sense static induction transistor is converted to a voltage drop;

a protection circuit for comparing said voltage drop across said sense resistor with a reference voltage; and a control circuit responsive to a drive signal for driving said first current source drive circuit when, in a comparison by said protection circuit, said reference voltage is higher than said voltage drop, and for driving said second current source driving circuit when said drive signal is not applied or said reference voltage is lower than said voltage drop.

* * * * *